United States Patent

Stern

[15] 3,683,369

[45] Aug. 8, 1972

[54] ANALOG TO DIGITAL CONVERTER

[72] Inventor: David M. Stern, Merion Station, Pa.

[73] Assignee: Honeywell Inc., Minneapolis, Minn.

[22] Filed: June 25, 1971

[21] Appl. No.: 156,715

[52] U.S. Cl...........................................340/347 AD
[51] Int. Cl...........................................H03k 13/20
[58] Field of Search.....340/347 AD; 324/99 R, 99 D

[56] References Cited

UNITED STATES PATENTS 2,963,697 12/1960 Giel..........................340/347
3,493,964 2/1970 Hunger......................340/347

*Primary Examiner*—Maynard R. Wilbur
*Assistant Examiner*—Charles D. Miller
*Attorney*—Arthur H. Swanson et al.

[57] ABSTRACT

An analog-to-digital conversion system uses a comparator to detect an equality between an analog input signal and a ramp reference signal to determine the counting interval of a counter counting constant frequency signals. A plurality of auxiliary comparators are used to compare the input signal with respective ones of a plurality of constant reference signals. The auxiliary comparators are each arranged to preset a corresponding count into the counter upon a detected equality between the input signal and a respective one of the constant reference signals whereby the counter is set to a count representing a desired slope of the ramp reference signal.

5 Claims, 2 Drawing Figures

INVENTOR.
DAVID M. STERN
BY M. J. Halista

ANALOG TO DIGITAL CONVERTER

BACKGROUND OF THE INVENTION

The handling of the data particularly in the field of process control has often required a conversion of an analog quantity representing a physical parameter into digital form for recording, display or subsequent digital computer applications. A well-known prior art conversion technique, as shown in U.S. Pat. No. 2,272,070 of A.H. Reeves, is based on the method of equating equal intervals of time with equal increments of voltages along a linear ramp function. That prior art decoder has a predetermined ramp voltage generator, comparison means for establishing a time interval during which the ramp voltage reaches the level of the analog input signal and counting means for counting the number of reference clock pulses which occur during the time interval. That prior art system has had an inherent accuracy of conversion which is dependent directly on the accuracy of the slope of the voltage ramp signal and the frequency of the reference clock pulses. Since there is no correlation between the slope of the ramp and the frequency of the clock pulses each clock pulse may not represent the same number of reference voltage units. Thus, when the ramp voltage equals the analog input signal, the accumulated number of voltage increments indicated by the corresponding time length of the ramp would not indicate the true numerical, or digital, value of the analog input signal. The primary source of errors in such a ramp conversion system lies in errors in the generation of the ramp voltage. These errors may arise from current leakage in the circuit, drift in component values or by non-linear effects associated with the comparator and the ramp voltage generator. They may be manifested either as a change in the slope of the ramp signal or as a deviation from linearity of the ramp signal.

An object of the present invention is to provide an improved analog-to-digital converter.

Another object of the present invention is to provide an improved alalog-to-digital converter using a time interval conversion technique.

A further object of the present invention is to provide an improved time interval analog-to-digital converter having a self-compensating capability for providing a linear approximation to a desired time interval measuring function.

SUMMARY OF THE INVENTION

In accomplishing these and other objects, there has been provided, in accordance with the present invention, a analog-to-digital converter having a first comparison means for comparing an analog input signal with a ramp reference signal from a ramp signal generator. This comparison means is arranged to establish a time interval during which a counter is allowed to count clock pulses and to effectively terminate the counting operation at the end of the time interval as determined by a sensed equality between the analog input signal and the ramp reference signal. A plurality of auxiliary voltage comparators are connected between the source of the ramp reference signal and respective constant reference signals. When an equality is detected by each of the auxiliary comparators between its reference signal and the instantaneous value of the ramp reference signal, a count preset operation is performed on the counter to introduce a predetermined count into the counter. The auxiliary comparators produce respective count preset operations at respective points along the ramp reference signal to effect a piece-wise linear approximation to a desired linear ramp function of the ramp signal from the ramp signal generator.

BRIEF DESCRIPTION OF THE DRAWINGS

A better understanding of the present invention maybe had from the following detailed description when read in connection with the accompany drawings in which.

DETAILED DESCRIPTION

Figure 1:
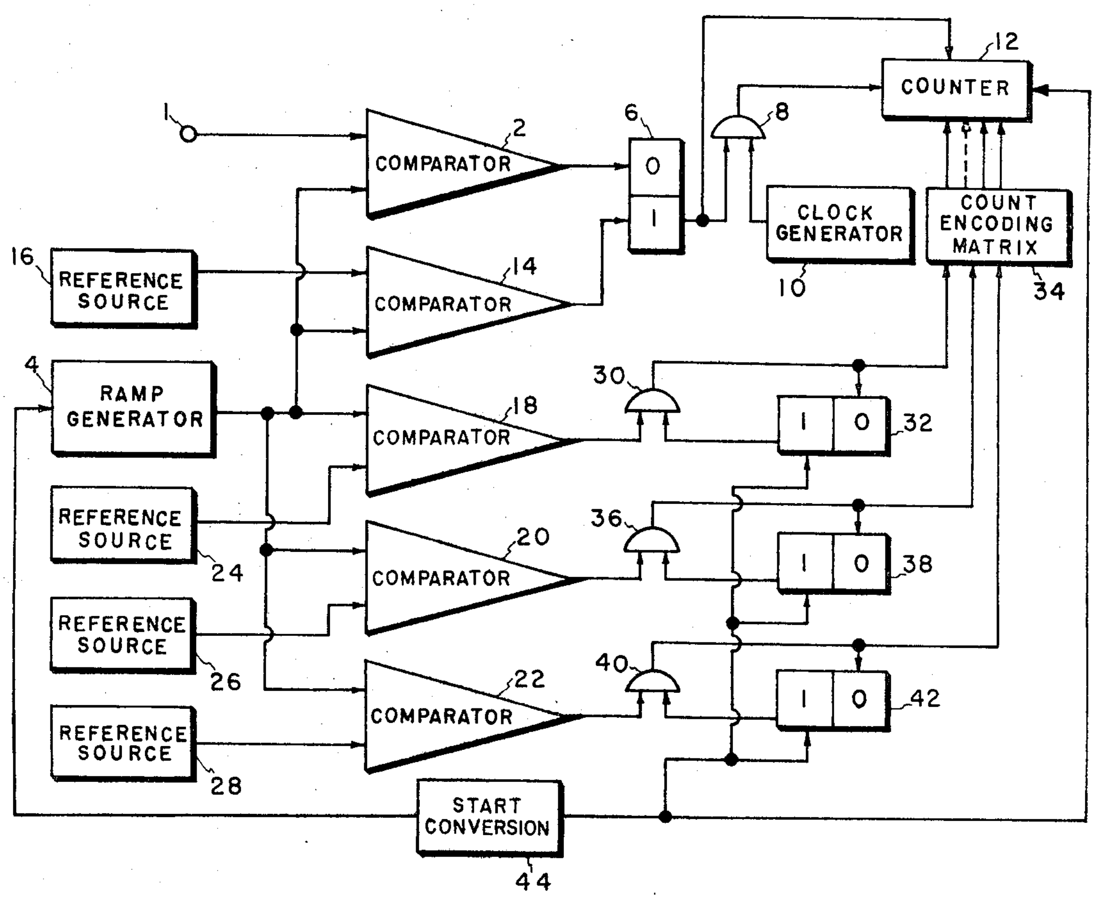
FIG. 1 is a block diagram of an analog to digital converter embodying the present invention.

Referring to FIG. 1 in more detail, there is shown an analog-to-digital converter embodying the present invention and having an input signal terminal 1 which is arranged to be connected to a source of analog signal to be converted. The input terminal 1 is connected to a first input of a signal comparator 2 which may be any suitable well known device which is effective to compare two input signals and to produce an output signal upon a detected equality occurring therebetween. The other input signal for the first comparator 2, to be compared with the first input signal from the input terminal 1, is obtained from a ramp signal generator 4. The ramp signal generator 4 may be any suitable prior art device for generating a periodically occurring saw tooth waveshape having a predetermined slope and amplitude limits such devices also being well-known in the art. The output signal from the first comparator 2 is applied as an input signal to one side of a first flip-flop 6, e.g., the logical 0 side. An output signal from the other side of the first flip-flop 6, i.e., the logical 1 side, is applied as a first input signal to a first AND gate 8. Another input signal for the first AND gate 8 is obtained from a clock signal generator 10. An output signal from the first AND gate 8 is applied to a counter 12 to be counted thereby.

The output signal from the ramp generator 4 is, also, applied to a second comparator 14 as one input signal thereto. The second comparator 14 may be a circuit such as that used for the first comparator 2.

A second input signal for the second comparator 14 is obtained from a first reference signal source 16, e.g., a battery and a potentiometer connected there across. The output signal from the second comparator 14 is applied to the other side of the first flip-flop 6, e.g., the logical 1 side. A plurality of auxiliary comparators, illustrated for the purpose of simplicity as a third comparator 18, a fourth comparator 20, and a fifth comparator 22, each have one input connected to the output of the ramp generator 4 and a second input connected to a respective one of a plurality of constant reference signal sources which may be similar to the first source 16. Specifically, the second input of the third comparator 18 is connected to a second reference signal source 24, the fourth comparator 20 is connected to a third reference signal source 26 and the fifth comparator 22 is connected to a fourth reference signal source 28. The additional comparators 18, 20 and 22 may be similar to the previously described first and second comparators 2 and 14. The output signal from the third comparator 18 is applied to one input of a second AND gate 30. A second input signal for the second AND gate 30 is obtained from one output side, e.g., the logical 1 side, of a second flip-flop 32. An output signal from the second AND gate 30 is applied to the other side, e.g., the logical 0 side, of the second flip-flop 32 and to a count encoding matrix 34. The encoding matrix 34 may be any suitable prior art capable of accepting an input signal on one of a plurality of input lines and producing a predetermined pattern of output signals on a plurality of output lines. Examples of suitable matrices for use as the encoding matrix 34 are shown in U.S. Pat. Nos. 2,937,285; 2,939,121 and 2,946,043. Similarly, an output signal from the fourth comparator 20 is applied to a first input of a third AND gate 36 while an input signal for a second input thereof is obtained from one output side, i.e., the logical 1 side, of a third flip-flop 38. An output signal of the third AND gate 36 is applied to the other side of the third flip-flop 38 and to the encoding matrix 34. In a like manner, the output signal of the fifth comparator 22 is applied to a first input of a fourth AND gate 40 while a second input signal to the fourth AND gate is obtained from one output side, i.e., the logical 1 side, of a fourth flip-flop 42. The output signal from the fourth AND gate 40 is applied to the other input side of the fourth flip-flop 42 and to the encoding matrix 34. The encoding matrix 34 maybe any suitable well-known cross-coupling circuit arranged to selectively couple input signals applied on each of a plurality of input lines to a respective predetermined combination of a plurality of output lines whereby a plurality of count stages of the counter 12 may be affected by each input signal to the matrix 34. Thus, an input signal on one input line to the matrix 34 is effective to preset a first count into the counter 12 while a input signal on a second input line is effective to preset a second count into the counter 12. A conversion start means 44, e.g., a signal source connected through a push-button, is arranged to apply a "-start" signal to the ramp generator 4 and a flip-flop "-set" signal to the second, third and fourth flip-flops 32, 38, and 42 to set these flip-flops to the logical 1 state which is arranged to apply input signal to the associated AND gates 30, 36, and 40.

In operation, the conversion circuit of the present invention is arranged to start an analog-to-digital conversion operation by means of the conversion start circuit 44 which may be, as described above, any suitable well-known circuit, e.g., a manual push-button operated circuit. The start of a conversion operation is effective to start a ramp output signal from the ramp generator 4, which signal is applied as an input signal to all of the comparators 2, 14, 18, 20 and 22. The second comparator 14 is arranged to compare the ramp signal with a low, e.g., zero, amplitude reference signal the first reference source 16 to synchronize the conversion circuit to the start of a conversion operation. Accordingly, when this level of the ramp signal from the ramp generator 4 is sensed by the second comparator 14, an output signal from the comparator 14 representative of this detected level is applied to the logical 1 side of the first flip-flop 6. Setting the first flip-flop 6 to the logical 1 side is effective to apply an energizing signal to the first AND gate 8 whereby the signals from the clock generator 10 are passed through the first AND gate 8 to the counter 12. Thus, at the start of the conversion operation, the output signal from the second comparator 14 is used to start the count of the clock signals by the counter 12.

During the conversion operation, the first comparator 2 is arranged to compare an input signal to be converted, applied to the input terminal 1, with the ramp signal being generated by the ramp generator 4. Concurrently, the third, fourth, and fifth auxiliary comparators 18, 20, and 22 are performing respective comparison operations of the increasing level of the ramp signal from the ramp generator 4 with their respective reference signals from the corresponding ones of the reference signal sources 24, 26 and 28. As soon as an equality is detected by the one of the auxiliary comparators 18, 20, and 22 having the lowest reference signal level applied thereto, e.g., the third comparator 18, an output signal from that comparator is applied to its associated AND gate 30. Since the second input to the second AND gate 30 is taken from the logical 1 side of the second flip-flop 32 which has been set to the logical 1 state by the conversion start means 44, the output signal from the third comparator 18 is immediately applied to the encoding matrix 34. The output signal from the encoding matrix 34 in response to the input signal from the second AND gate 30 is effective to preset a first predetermined count into the counter 12. Thus, regardless of the actual count in the counter 12 at the time of the input signal to the encoding matrix 34, a predetermined count is forced, or preset, into the counter 12. Of course, if the count in the counter 12 is the same as the preset count at the time of the presetting operation, no change in the stored count is effected. The counter 12, subsequently, continues its counting of the signals from the clock generator 10 from this preset count. The output of the second AND gate 30 is also applied to the other side, e.g., the logical 0 side, of the second flip-flop 32 to "reset" this flip-flop to its logical 0 state. This state of the flip-flop is effective to deenergize the second AND gate 30 to prevent further operation of the encoding matrix 34 by the third comparator 18. The aforesaid process of presetting a count into the counter 12 is repeated for the remaining comparators 18 and 22 using the corresponding ones of the remaining AND gates 36 and 40.

During the aforesaid operation of the third, fourth, and fifth comparators 18, 20, and 22, the first comparator 2 is continuing to compare the ramp signal from the ramp generator 4 with the input signal applied to the input terminal 1. When an equality is detected therebetween, an output signal from the first comparator 2 is applied to the logical 0 side of the first flip-flop 6 to reset this flip-flop to the logical 0 state. This state of the first flip-flop 6 is effective to remove the energizing signal from the first AND gate 8 whereby the clock signals from the clock generator 10 are blocked from being applied to the counter 12. At this point, the count stored in the counter 12 is indicative of the digital value of the analog signal applied to the input terminal 1. Since the end of the comparasion operation by the first comparator 2 may take place before the ramp from the ramp generator 4 has reached its maximum level, the operation of either some or all of the count-forcing comparators 18, 20 and 22, may not be desired. Under these conditions, the count in the counter 12 may be erroneously changed from the desired digital value by the subsequent operation of the unoperated ones of the comparators 18, 20 and 22 during the remainder of the ramp signal following the detection of an equality by the first comparator 2. In order to prevent such an undersired count change from the desired digital value, the logical 1 side of the first flip-flop 6 may be connected to the counter 12 to allow changes in the counts stored therein only during the time that the first flip-flop 6 is in its logical 1 state. For example, the outputs from the encoding matrices 34 may be applied to the counter stages through respective AND gates (not shown) in the counter 12 which are energized by the output signal from the logical 1 side of the first flip-flop 6.

Figure 2:
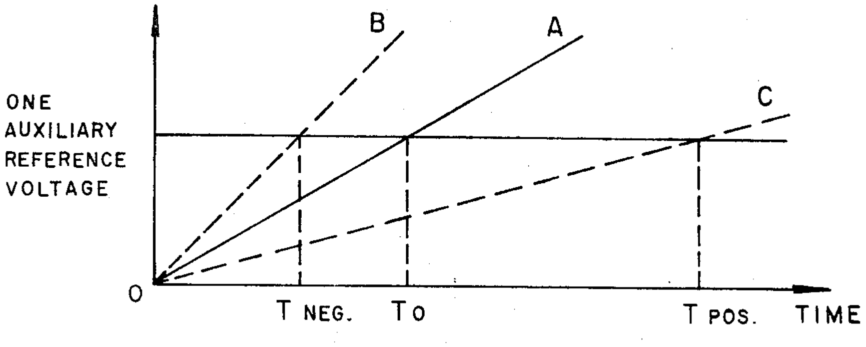
FIG. 2 is a waveshape diagram of the ramp functions encountered by the embodiment of the invention shown in FIG. 1.

The use of the auxiliary comparators 18, 20 and 22 permits the preset counts to be spaced at intervals along the slope interval of the ramp signal. These intervals are selected to lie in the area of maximum non-linearity of the ramp to provide a maximum corrective action whereby the ramp can be assured of operating the conversion operation as if the ramp signal had the required linearty and slope. A zero error system, of course, results when the actual ramp function exactly matches over its entire range the equivalent desired ramp function. This matching is effectively approximated with respect to the counting operation of the counter 12 by the preset counts of the counter 12 which are forced, as previously described, by the operation of the auxiliary comparators 18, 20 and 22. For example, if the slope of the ramp signal is too high, this would produce a detected equality of the ramp and input signal by the first comparator 2 at a count by the counter 12 before the correct count actually representative of the digital value of the input signal. Such a high slope ramp would produce a preset count from one of the auxiliary comparators 18, 20 and 22 to preset a count into the counter 12 which is lower than the count stored in the counter 12 at the time of operation of the auxiliary comparator. This corrective action is shown for high slope waveshape B of FIG. 2 while waveshape A represents the desired ramp slope. Conversely, the presence of a low slope ramp as shown by waveshape C of FIG. 2 will produce a preset operation of a higher count than the count stored in the counter 12. In either case, the operation of the auxiliary comparators 18, 20 and 22 is effective to bring the count in the counter 12 to the value which should have been present if the ramp signal had had the desired slope. Thus, the auxiliary comparators 18, 20 and 22 provide separate corrective operations which corrections are each effective to reduce the effect of the ramp error by a factor of two, enabling an additional binary bit of accuracy to be added to the conversion system. Further, while the illustrated embodiment is shown with three auxiliary comparators, it should be noted that the actual number may be different from this exemplary figure in order to provide the desired degree of compensation.

Accordingly, it may be seen that there has been provided, in accordance with the present invention, an improved analog-to-digital time interval conversion system using a self-compensated linearizing of the effect of a ramp function to approximate a desired time interval measuring function.

The embodiments of the invention in which an exclusive property or privilege is claimed are defined as follows:

1. An analog-to-digital converter comprising a source of constant frequency signals, counter means for counting said signals, gate means connected between said source and said counter means, ramp signal generating means, first comparator means for comparing a ramp signal from said generating means with an input signal to be converted and for selectively operating said gate means to admit said constant frequency signals to said counter means at the start of the ramp signal and to block said frequency signals from said counter means upon a detected equality between the input signal and an instantaneous level of the ramp signal, a plurality of constant reference signal sources, said sources being arranged to produce respective reference signals representing various instantaneous levels of the ramp signal, a plurality of auxiliary comparators arranged to compare the ramp signal with a respective one of the reference signals from said reference signal sources, and counter preset means responsive to said auxiliary comparators and arranged to preset said counter means to each of a plurality of predetermined counts with each count corresponding to an output signal from a respective one of said auxiliary comparators.

2. An analog-to-digital converter as set forth in claim 1 wherein said counter preset means including an encoding means arranged to encode an output signal from an auxiliary comparator into a count preset signal for said counter means.

3. An analog-to-digital converter as set forth in claim 1 wherein said plurality of auxiliary comparators is three signal comparators and said plurality of reference signal sources is three reference signal sources.

4. An analog-to-digital converter as set forth in claim 1 wherein said auxiliary comparators include gate means arranged to allow an energization of said counter preset means by each of said auxiliary comparator means and to block any subsequent attempts at energization from any of said auxiliary comparator after said energization.

5. An analog-to-digital converter as set forth in claim 1 and including means arranged to prevent a counter preset operation by said preset means after gate means is operated by said first comparator means to block said frequency signals from said counter means.

* * * * *